United States Patent [19]
Kawakami et al.

[11] Patent Number: 6,015,975
[45] Date of Patent: Jan. 18, 2000

[54] METHOD AND APPARATUS FOR CHARGED PARTICLE BEAM EXPOSURE

[75] Inventors: Kenichi Kawakami; Masahiko Susa; Kobayashi Katsuhiko; Akio Yamada; Koichi Yamashita; Naoki Nishio, all of Tokyo, Japan

[73] Assignee: Fujitsu Limited, Kawasaki, Japan

[21] Appl. No.: 08/956,437

[22] Filed: Oct. 23, 1997

[30] Foreign Application Priority Data

Apr. 10, 1997 [JP] Japan ..................................... 9-092248

[51] Int. Cl.[7] .................................................. H01J 37/302
[52] U.S. Cl. ...................................................... 250/492.22
[58] Field of Search ........................................ 250/492.22

[56] References Cited

U.S. PATENT DOCUMENTS 5,610,406  3/1997  Kai et al. ............................ 250/492.22
5,817,442  10/1998  Okino ........................................ 430/30

*Primary Examiner*—Jack I. Berman
*Attorney, Agent, or Firm*—Staas & Halsey LLP

[57] ABSTRACT

The present invention is a method of charged particle beam exposure wherein an area of an exposure pattern is exposed by irradiating a sample with a charged particle beam while moving said sample, comprising: a step of generating speed data including the speed distribution in a direction of movement of the sample in accordance with secondary data which is generated from a pattern data including at least data of the exposure pattern and data of an exposure position, and includes at least density information of the exposure pattern; and a step of irradiating the sample with the charged particle beam in accordance with the pattern data while being moved at variable speed in accordance with the speed data. According to the invention, the through-put is improved very much without any defect of the exposure.

21 Claims, 17 Drawing Sheets

Pattern Data

Positional Data

Frame 39 and Pattern Data 37

NUMBER DISTRIBUTION OF THE AMOUNT OF
CHANGE IN THE DEFLECTION POSITION

NUMBER DISTRIBUTION OF THE AMOUNT OF
CHANGE IN THE DEFLECTION POSITION (PART 2)

Amount of Change of Mask Position
by Mask Deflectors (Jumping Distance)

| | | | | | |
|---|---|---|---|---|---|
| MA5 | N51 | N52 | N53 | N54 | N55 |
| MA4 | N41 | N42 | N43 | N44 | N45 |
| MA3 | N31 | N32 | N33 | N34 | N35 |
| MA2 | N21 | N22 | N23 | N24 | N25 |
| MA1 | N11 | N12 | N13 | N14 | N15 |
| 0 | SDL1 | SDL2 | SDL3 | SDL4 | SDL5 |

Amount of Change of
Deflection Position
by Sub-deflector
(Jumping Distance)

METHOD AND APPARATUS FOR CHARGED PARTICLE BEAM EXPOSURE

BACKGROUND TO THE INVENTION

1. Field of the Invention

The present invention relates to an apparatus for and a method of exposure using electron, ion and other charged particle beams. More specifically it relates to an apparatus for and a method of exposure whereby a sample is exposed while being moved continuously on a stage.

2. Background of the Related Art

Charged particle beam exposure using electron and other beams (hereinafter referred to simply as 'electron beam exposure') is employed when creating fine patterns on LSI chips and similar products. The method requires that the wafer or other material be irradiated with a vast number of fine patterns, therefore its through-put is inferior to that of the conventional stepper. Fine patterns are created in a desired position on the material by deflecting the electron beam to generate the desired pattern, and then deflecting it again to the desired position on the wafer. The problem is that there are restrictions on the range of deflection of electron beams, and when this range is exceeded it becomes necessary to move the stage on which the material, i.e. wafer, is mounted.

However, a method of step and repeat in which the stage is moved and then stopped in order to attain the desired range of deflection necessitates a settling time after the stage has moved and before it comes to a standstill. This settling time is prolonged because the stage is moved mechanically. Consequently, to take an example where the material is a semiconductor wafer and there are 100 deflection areas within one chip, 100 times the abovementioned settling time is required in order to expose before completing the exposure at the point a single chip. This means that the exposure time for one wafer is immense.

For this reason, a method has been proposed whereby instead of being repeatedly moved and stopped in the abovementioned manner, the stage is subjected to continuous movement while the material is irradiated with an electron beam. This is known as the stage-scanning method. The stage is moved at a constant scanning rate during exposure. The result is that if the rate of movement of the stage is set too high, the exposure position at some point ceases to fall out of the area which is capable of being exposed before completing the exposure at the point, with consequent incomplete exposure. Conversely, if the rate of movement of the stage is set low enough to avoid incomplete exposure even in sections where high shot density within the exposure pattern necessitates maximum exposure time, the result is an overall lengthening of exposure and processing time.

This problem can be solved by adopting a method of exposure with variable-rate scanning. In other words, the rate of movement of the stage is varied while the sample is scanned.

Nevertheless, there are numerous problems which remain to be solved in relation to this variable-rate scanning exposure method. Suppose overall exposure time is shortened by setting the rate of movement of the stage as high as is feasible without running the risk of incomplete exposure. If while the stage is moving at high speed it suddenly comes to an area which requires longer exposure, it is not possible to decelerate in time, and this results in incomplete exposure. Controlling the rate of movement of the stage is a problem to which there is not necessarily any simple solution.

As an example of a means of solving this problem, the applicant of the present invention have proposed speed control by feedback as is described in Japanese laid open Patent Tokkaihei 7[1995]-272995. This method takes the optimum rate within the area to be scanned as the initial value, monitors continuously during exposure to check whether it is too fast or too slow, and varies the rate of movement in accordance with the feedback. However, this method fails to provide a necessary control for sudden deceleration as was mentioned above, and it is assumed that such circumstances would result in incomplete exposure.

Another solution which has been proposed calculates the time required for exposure from exposure pattern data and determines the speed distribution of the stage. However, higher levels of integration of LSI mean that the amount of pattern data as such is enormous, and any attempt to calculate exposure time directly from pattern data is flawed because the length of time required for calculation exceeds exposure time. Moreover, beam current values, deflection areas and other properties vary from one exposure apparatus to another, and are subject to variation with time even though the exposure apparatus may be the same, which means that it is frequently not possible to make repeat use of previously calculated speed distributions.

It is an object of the present invention to provide a method of variable-rate scanning exposure and an apparatus for that purpose, so as to solve the abovementioned problem.

It is a further object of the present invention to provide a charged particle beam exposure apparatus and a method of exposure which facilitate the exposure of a material in the minimum exposure time without the risk of incomplete exposure.

SUMMARY OF THE INVENTION

In order to attain the abovementioned object, a first aspect of the present invention is a method of charged particle beam exposure wherein an area of an exposure pattern is exposed by irradiating a sample with a charged particle beam while moving said sample, comprising:

a step of generating speed data including the speed distribution in a direction of movement of the sample in accordance with secondary data which is generated from a pattern data including at least data of the exposure pattern and data of an exposure position, and includes at least density information of the exposure pattern; and a step of irradiating the sample with the charged particle beam in accordance with the pattern data while being moved at variable speed in accordance with the speed data.

The abovementioned secondary data is generated from pattern data and includes at least density information of the exposure pattern. An example of such density information is the number of beam irradiation. For instance, having as secondary data the number of beam irradiation within the small block areas into which the scanning area is divided in the direction of scanning by the movement of the sample, it is possible to determine the exposure time within each small block area by cumulating the product of that number of irradiation and the exposure time. As a result, it is possible to determine the maximum rate of movement at which exposure is feasible in accordance with the size of that small block area. This maximum rate of movement forms the speed data for each small block area.

Secondary data may also include data relating to the number of times the deflection position of the beam is altered. Electrostatic deflectors are provided in order to deflect on to a prescribed position on the mask and on the sample. From the product of the settling or waiting time of these deflectors and the number of alteration of the deflection position, it is possible to determine the time required for exposure. Moreover, the time required for exposure can be determined with a greater degree of accuracy by including in the secondary data the number distribution according to the amount of change in the deflection position.

A characteristic point is that information relating to characteristics of the deflector is not included in the secondary data, with the result that it can be applied generally to other exposure apparatuses, even where changes with time are involved. The fact that the secondary data is determined in advance allows the stage speed distribution to be determined swiftly at the time of exposure with no detrimental effect on exposure speed.

In order to attain the abovementioned object, a second aspect of the present invention is method of charged particle beam exposure wherein an specified area of a sample is exposed by deflecting and irradiating a charged particle beam while moving the sample, comprising:

a step of determining a rate of movement corresponding to each small block area in accordance with the density of the exposure pattern within the small block area, each of the small block areas being within a frame area which has a width within a range wherein the deflection is attainable, and extends in the direction of the sample scanning as a result of the movement, the frame area being divided into the small block areas in the direction of the sample scanning; and a step of deflecting and irradiating the charged particle beam the sample while the sample is moved at a variable rate of movement corresponding to and not exceeding the rate of movement at each of the small block areas.

In this invention, for instance, the maximum rate of movement is determined for each small block area in advance from the secondary data, and the rate of movement is servo-controlled on the basis of this. Control is implemented at a speed as close as possible to the maximum speed, while ensuring that the actual speed does not exceed the maximum speed within any of the small block areas. This makes it possible to avoid incomplete exposure and to execute the exposure process in the shortest time. It differs from normal servo control, which is implemented in order to attain a target position in the shortest time.

DETAILED DESCRIPTION OF THE PREFERRED EMBODIMENTS

There follows a description of the preferred embodiment of the present invention with reference to the drawings. However, this embodiment in no way restricts the technical range of the present invention. The present invention can be applied to an exposure apparatus using charged particle beams: here it will be explained in relation to an electron beam exposure device.

[Overall Structure of the Charged Particle Beam Device]

Figure 1:
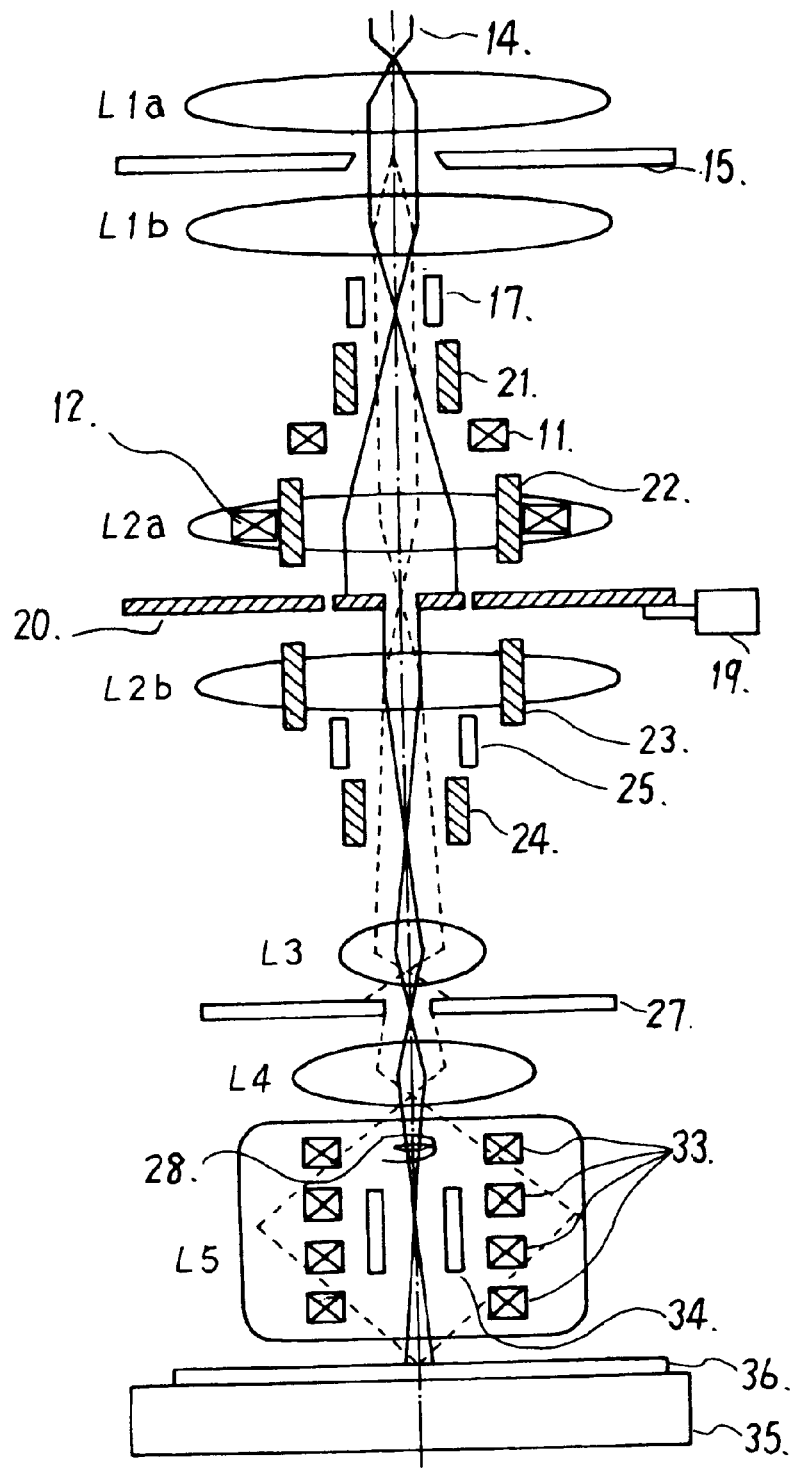
FIG. 1 is a schematic diagram showing the lens barrel of the electron beam exposure apparatus.

FIG. 1 is a schematic diagram showing the lens barrel of the electron beam exposure apparatus. A rectangular aperture 15 is irradiated, by way of an alignment coil not shown in the drawing and a lens L1a, with electron beams generated by the electron gun 14, which is the principal source of electrons. The rectangular electron beam generated as a result passes through a lens L1b and is incident upon a slit deflector 17. The slit deflector 17 is controlled by means of a corrective deflection signal not shown in the drawing and used for fine correction of position.

In order to shape the electron beam into the desired pattern, a mask 20 with a plurality of aperturs such as a block mask with a rectangular apertures or prescribed pattern is used. This mask 20 is mounted on a mask stage 19 which is capable of movement in a horizontal direction. In order to deflect the electron beam on to the desired block mask position, electromagnetic lenses L2a, L2b and deflectors 21–24 are provided above and below the mask 20. An astigmatism corrector 11 and image surface curvature corrector 12 are also provided above the mask 20.

In this way, the electron beam shaped by the pattern on the mask 20 irradiates or does not irradiate the wafer 36 (is switched on and off) under the control of a blanking electrode 25. When the blanking electrode 25 is on, the electron beam passes through another lens L3, and through a round aperture 27. The round aperture 27 acts as a sort of diaphragm, and its degree of opening can be controlled, allowing the convergence half-angle of the electron beam to be restricted. Final adjustment of the shape of the beam is effected with the help of an electromagnetic lens L4 and a reforcal coil 28. Although not shown on the drawing, there is a focus coil in the vicinity of the lens L4. This allows the beam to be focussed on the surface of the wafer 36, which is the target for exposure. A sting coil, also not shown in the drawing, is used to correct astigmatism.

In the final stage, the electron beam is reduced to the exposure size by means of a projection lens L5. A main deflector 33 and sub-deflector 34, which are controlled by an exposure position determining signal not shown in the drawing, then allow it to irradiate the correct position on the surface of the wafer 36. It should be added that the main deflector 33 is electromagnetic, while the sub-deflector 34 is electrostatic. The wafer 36, which is the sample, is mounted on a stage 35, which is capable of continuous movement. The method whereby the movement of this stage is controlled will be described later.

Figure 2:
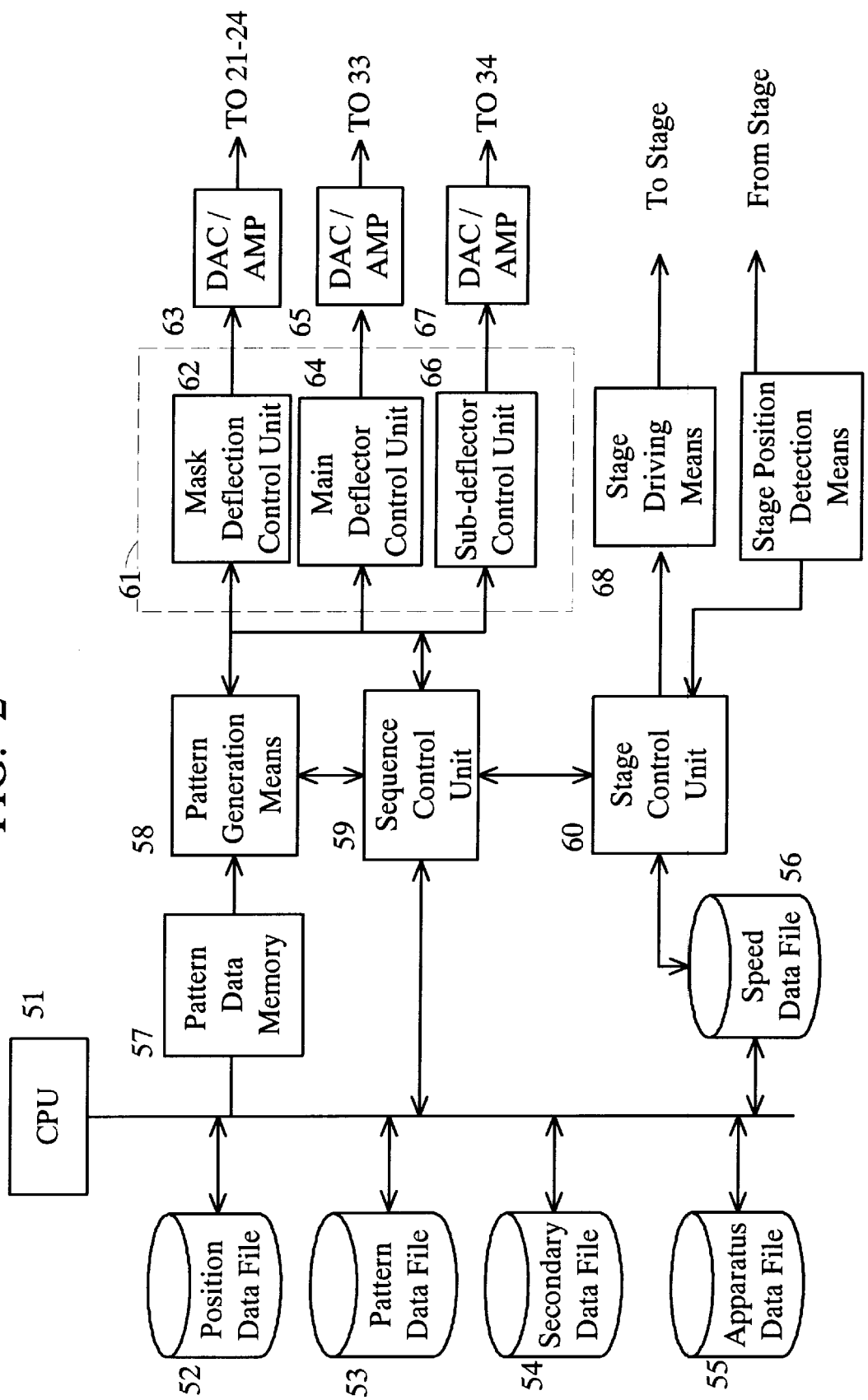
FIG. 2 is an outline schematic diagram showing the control unit of the electron beam exposure apparatus.

Activators, such as the deflectors, the electromagnetic lenses, and the stage, within the lens barrel of the abovementioned electron beam exposure apparatus are driven by control signals from a control unit, as are those for the stage and other components. FIG. 2 is an outline schematic diagram showing the control unit of the electron beam exposure apparatus.

The drawing illustrates the means of control for some of the abovementioned activators.

A positional data file 52, pattern data file 53, secondary data file 54, apparatus data file 55 and speed data file 56 are connected to the CPU 51 by way of buses. Pattern data for an exposure target, for example, is read by the CPU 51 from the pattern data file 53 and stored in the pattern data memory 57. Data relating to such as which pattern within the mask 20 is to be used (irradiated) and what position on the wafer 36 the electron beam is to irradiate is then generated by pattern generation means 58. Among this data, irradiation pattern data is imparted to a mask deflection control unit 62 within an activator control unit 61. Digital deflection drive signals generated by this control unit 62 are converted to analog drive signals by a corresponding means of digital/analog conversion and amplifier 63, and imparted to the mask deflectors 21–24.

A sequence control unit 59 controls the drawing processing sequence of the electron beam in the exposure process. It therefore receives the irradiation pattern data, irradiation position data and other data generated by the pattern generation means 58, and controls the overall drawing processing. More specifically, it synchronises the activator control unit 61 and the stage control unit 60. It also imparts the respective deflection position data to a main deflector control unit 64, a sub-deflector control unit 65 and elsewhere in accordance with the irradiation position data. The main deflector control unit 64 and sub-deflector control unit 65 generate digital deflection signals corresponding to the irradiation position. These are converted into analog deflection signals by means of digital/analog converters and amplifiers 65, 67, and imparted to the respective deflectors 33, 34.

The sequence control unit 59 also imparts data necessary for stage movement to the stage control unit 60. This includes, for instance, data relating to the position of the pattern which is currently being exposed. The stage control unit 60 imparts a drive signal to a stage driving means 68, and receives data relating to the current position of the stage from a stage position detection means 69, which comprises a laser gauge interferometer and other elements.

In the embodiment of the present invention, the rate of movement of the stage is controlled and varied. The rate of movement is set, for example, in accordance with speed data generated by the CPU 51 on the basis of data in the secondary data file 54. In this example, the CPU 51 temporarily stores speed data generated on the basis of the secondary data file in the speed data file 56, and the speed data is imparted from that file 56 into the stage control unit 60. In the stage control unit 60, the actual rate of stage movement is determined by servo control based on this speed data, and an optimum movement control signal is generated to be imparted to the stage driving control 68.

Although it is not shown in FIG. 2, the actuator control unit 61 contains in addition to the abovementioned items a mask stage movement control unit and blanking deflector control unit. The various correction values generated in accordance with exposure pattern data which is in turn generated by the pattern generation means 58 are imparted other control unit for the astigmatism corrector 11, image surface curvature corrector 12, and refocal lens not shown in the drawing.

Figure 3A:
FIGS. 3A, 3B, and 3C are diagrams showing pattern and positional data, and the scan area on the wafer which forms the sample.
Figure 3B:
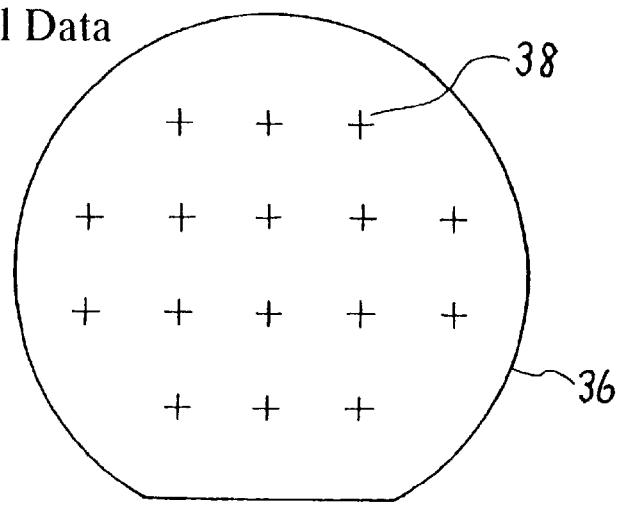
Figure 3C:
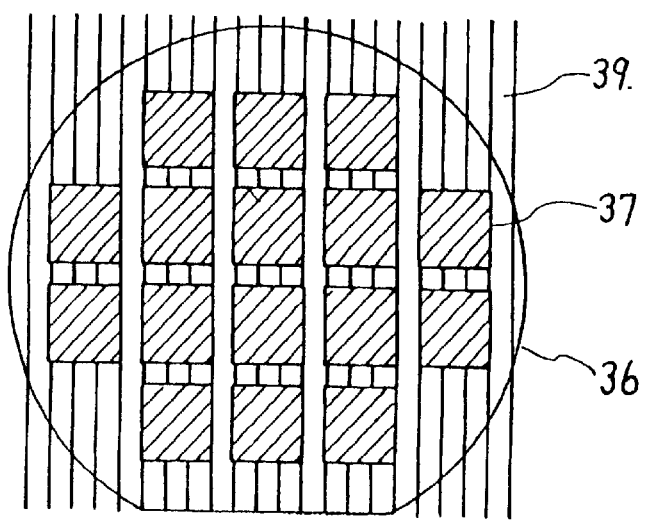

FIGS. 3(A), 3(B), and 3(C) are diagrams showing pattern data and positional data, and frame 39 which is the scan area on the wafer 36 which is the sample. The pattern data file 53 shown in FIG. 2 stores, for instance, pattern data for exposure within the chip area 37 as shown in FIG. 3(A). This pattern data may be configured in various ways, and it is possible to adopt any data configuration used by an ordinary skilled person.

FIG. 3(B) serves to elucidate the positional data within the positional data file 52 in FIG. 2. In other words, pattern data for each chip as shown in FIG. 3(A) is exposed at the positions 38 within the wafer 36 as shown in FIG. 3(B). As a result of this, a plurality of chip areas on the wafer 36 is irradiated with an electron beam of an exposure pattern corresponding to each of the pattern data, as may be seen in FIG. 3(C). That is to say, that area of the resist layer formed on the surface of the wafer 36 which corresponds to the exposure pattern is exposed by means of the electron beam.

FIG. 3(C) illustrates an example of the relationship between the wafer 36, chip area 37, and the frame 39 which forms the scan area while exposing and continuously moving the wafer 36. The frame area 39 is a strip area into which the surface of the wafer 36 is divided. That is to say, since the deflection range of the electron beam is only a few millimetres, the surface of the wafer 36 is divided for the purpose of exposure into parallel frame areas 39, each of which has a width of several millimetres. One chip area 37 is covered by a plurality of frame areas 39. In the example shown in FIG. 3(C), one chip area 37 is covered by three frame areas 39.

Figure 4:
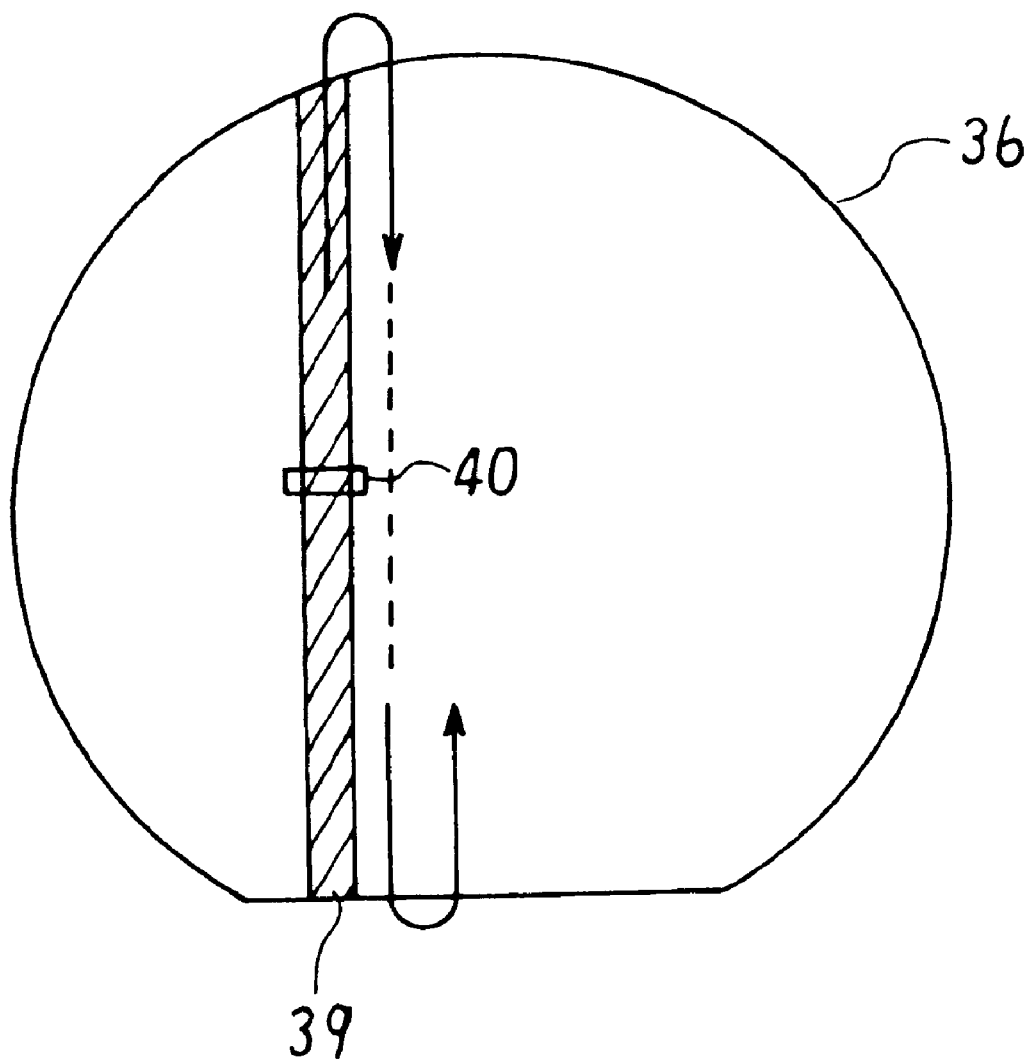
FIG. 4 shows how the exposure area of the electron beam is scanned as a result of the movement of the stage on which the wafer is mounted.

FIG. 4 shows how the exposure area of the electron beam is scanned as a result of the movement of the stage on which the wafer is mounted. The movement of the stage is controlled in such a way that the exposure area moves in line with the abovementioned frame areas 39. As the arrow shows in FIG. 4, when the exposure of one frame area 39 is complete, the exposure area moves in the opposite direction in line with the adjacent frame area.

Figure 5:
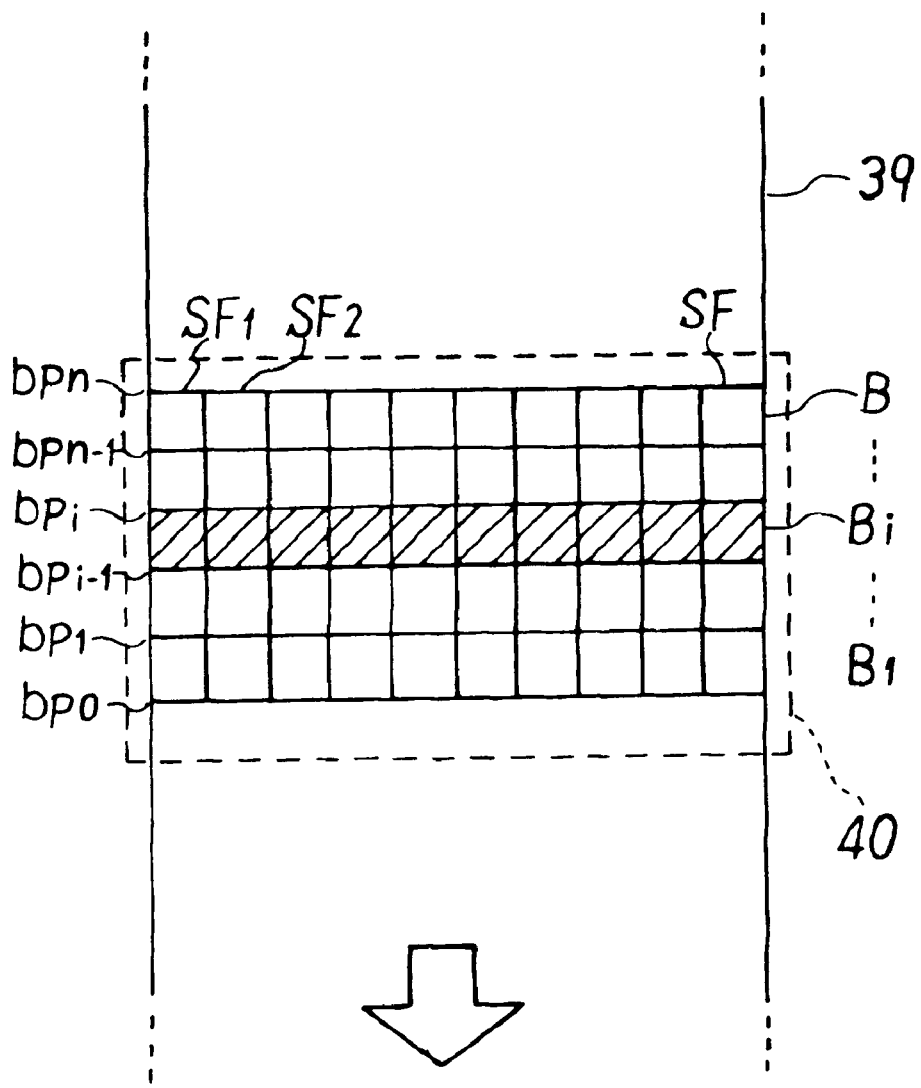
FIG. 5 shows an example of a deflection area within a frame area.

FIG. 5 shows an example of a deflection area within a frame area 39. The main deflector shown in FIG. 1 is usually configured as an electromagnetic deflector, and deflection is attainable over a relatively large range of several millimetres. However, in the case of an electromagnetic deflector, inductance makes it slow to respond. The sub-deflector, on the other hand, is normally configured as an electrostatic deflector, which means that deflection is attainable only over a range of several microns but it is quick to respond. The main field, which is capable of being deflected by the main deflector, is normally divided into sub-fields capable of deflection by the sub-deflector. An electron beam having a pattern formed with the aid of a block mask is deflected on to the desired position by a combination of main deflector and sub-deflector.

One part 40 of the frame 39 illustrated in FIG. 4 shows the area over which deflection by the main deflector is attainable. As shown in FIG. 5, this deflection area 40 includes a plurality of sub-fields SF over which deflection is attainable by the sub-deflector. A plurality of sub-fields SF is arrayed in a direction perpendicular to the direction of movement of the wafer 39 along the frame 39. The area over which these sub-fields are arrayed in a line is known as a band B. In FIG. 5, the rate of movement of the stage is controlled in such a way that the exposure processing of a shaded band Bi is completed while that band is positioned, for instance, within the deflection area 40. In the drawing, bp0–bpn represent the boundaries of the bands B.

Figure 6:
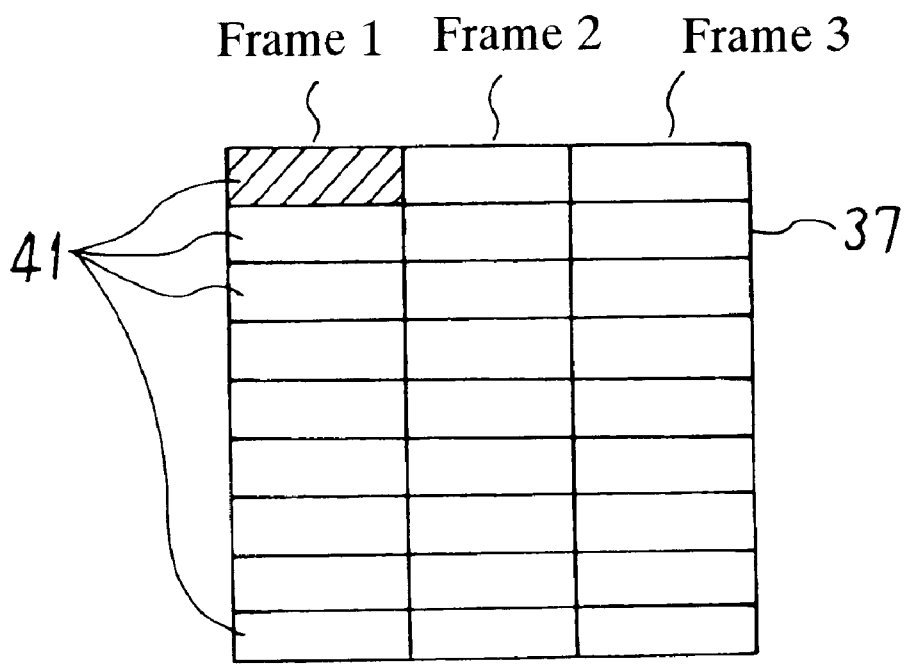
FIG. 6 shows an example of the relationship between frames within the chip area and the deflection range of the main deflector.

FIG. 6 shows an example of the relationship between frames within the chip area 37 and the deflection range of the main deflector. As is clear from FIGS. 3–5, the chip area 37 in this example is covered by three frames, each of which is divided into a plurality of small block areas 41. These small block areas 41 comprise a plurality of bands B, and correspond to a main field of the main deflector for example.

Figure 7:
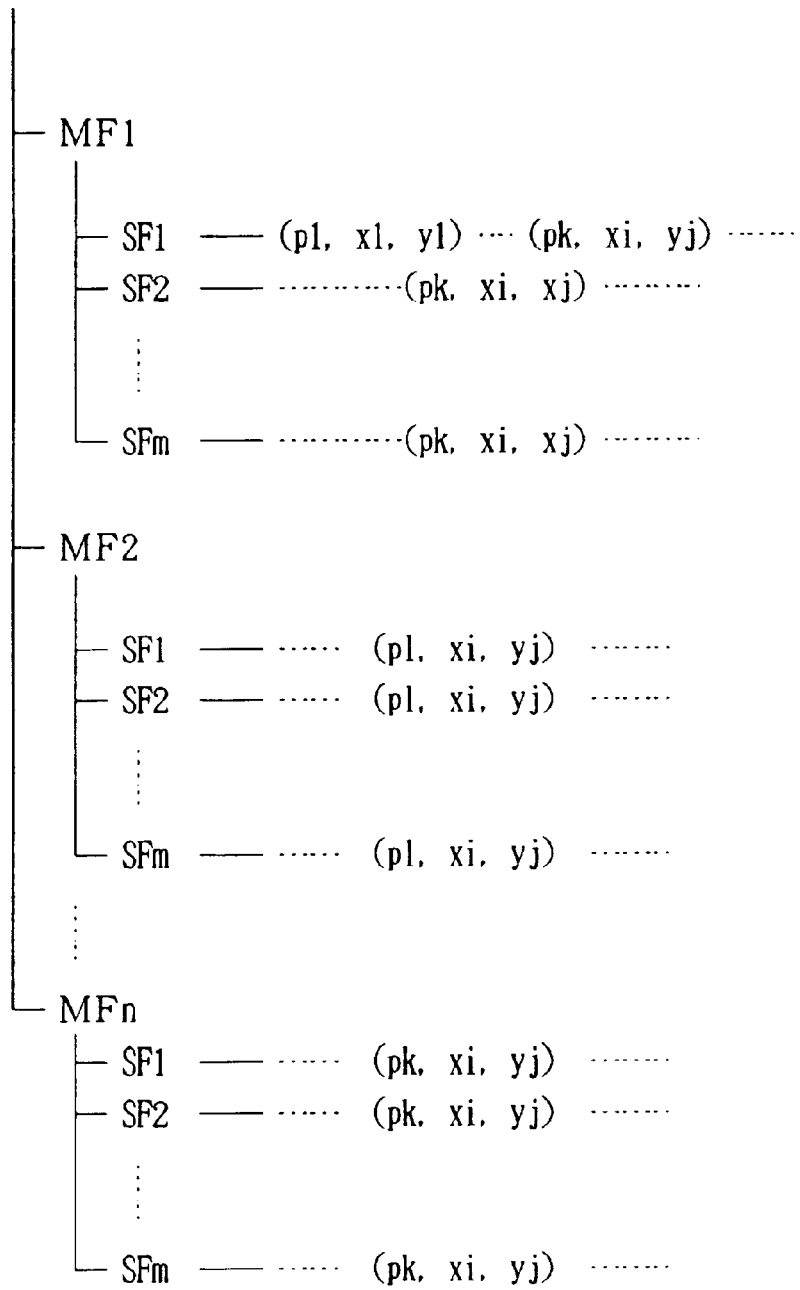
FIG. 7 shows an example of the structure of pattern data.

FIG. 7 shows an example of the structure of pattern data within a pattern data file 53. The pattern data includes at least data relating to the pattern P, which is the shape of the irradiating beam, and the positions (x, y) which it irradiates. To be more precise, where the block mask method is adopted, the shape of the beam consists of data concerning which apertures within the mask 20 are used. Where the blanking aperture method is adopted, it comprises data relating to the pattern numbers on a pattern table separately prepared and stored in a file.

This pattern data comprises, for instance, data relating to one chip area. Consequently, as will be seen from FIG. 6, one chip area comprises a plurality of main field areas, and each main field area comprises a plurality of sub-field areas. This means that the pattern data is also divided into a plurality of main fields MF1–MFn, as is shown in FIG. 7, each of which is divided into a plurality of sub-fields SF1–SFm. To each of these sub-fields SF is imparted exposure pattern data (P1, x1, y1)–(Pk, xk, yk).

It is desirable from the point of view of controlling the variable speed of the sample that the pattern data within the pattern data file should be divided into main fields and sub-fields in this manner. In other words, the situation regarding the density of the exposure patterns within the sub-fields and the time required to expose them differs from one sub-field to another. Thus, it goes without saying that the time required to expose one band, which is composed of a plurality of sub-fields, also differs. As FIG. 5 shows, if exposure is accompanied by continuous movement along the frame 39, the rate of that movement must be controlled in accordance with the time required to expose each band. Alternatively, the rate of movement within a unit consisting of a plurality of bands must be controlled in accordance with the time required to expose that section. Consequently, it is vital for the pattern data to be divided by sub-fields, which are a constituent element of the bands.

Figure 8:
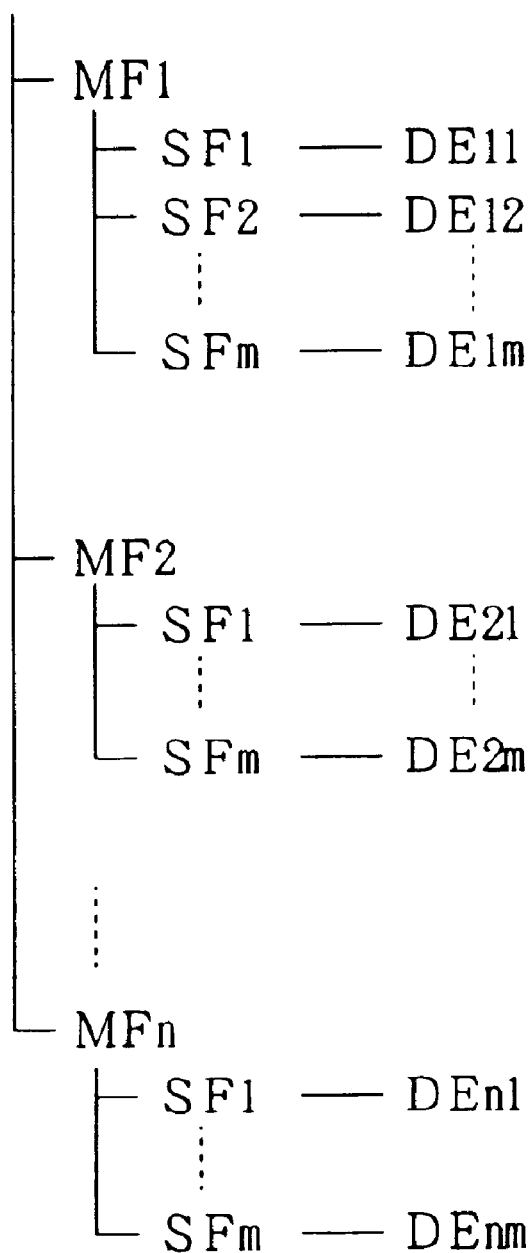
FIG. 8 shows an example of the structure of secondary data in a secondary data file.

FIG. 8 shows an example of the structure of secondary data in a secondary data file 54. In the embodiment of the present invention, secondary data includes information which is necessary in order to calculate the distribution of the rate of movement of the stage. Such secondary data is compiled in advance before exposure. Thus it is possible to calculate the speed distribution of each frame from this secondary data and positional data.

A first example of this secondary data comprises the irradiation density (shot density) of the electron beam consisting of the pattern P. In order to expose by irradiation with an electron beam of one pattern, it is necessary to effect chemical changes in the resist film on the sample. As was shown in FIG. 1, the electron beam must first be deflected on to the desired position within the mask 20, then by means of the main deflector 33 and sub-deflector 34 on to the desired position on the sample. There is a certain amount of variation depending on changes in the deflection positions, but the average time required, for instance, to expose by means of irradiation with an electron beam of one pattern can be expected mainly from the exposure time and similar factors. Thus, storing the distribution of shot density of frames within a chip in the direction of scanning in advance as a secondary data file makes it easy to discover the speed distribution in the direction of scanning within all the frames of a wafer 36, once the positional data relating to the chips within the wafer is determined.

In the example of secondary data shown in FIG. 8, the shot density data DE is divided into sub-fields SF. In other words, data relating to shot number (how many times the shot is executed) within the sub-field SF1 of the main field MF1 is stored within that sub-field as DE11. Since in this example it is already divided into sub-fields, the shot number within the area is essentially equivalent to the shot density. Thus it is a simple matter to determine the shot density for each band by using this secondary data. The various shot densities within the small blocks 41, which comprise a plurality of bands, can also be determined without difficulty.

Figure 9:
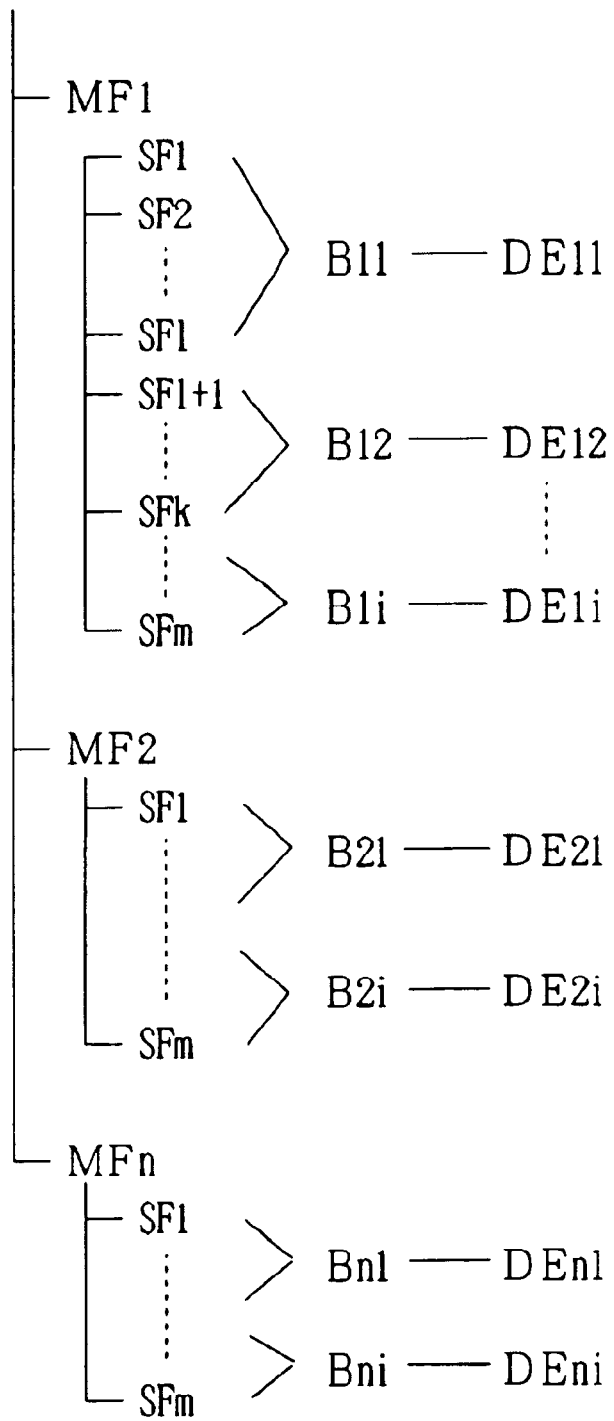
FIG. 9 shows another example of the structure of secondary data.

FIG. 9 shows another example of the structure of secondary data. In this example, the shot density data DE for each band B consisting of a plurality of sub-fields SF is determined and stored. This configuration allows the time required for exposure of each band to be determined roughly from the product of the shot density and an average exposure time. The exposure time required for one shot depends not only on an exposure apparatus, resist and other factors, but also on the process. Such data is therefore stored, for instance, in the apparatus data file 55, whence it can be read.

A second example of secondary data includes, in addition to the shot number for each of the abovementioned specified areas, the number of change of the deflection position (jump frequency) and the number distribution of the amount of that change. The deflectors are the electrostatic deflectors 21–24 which serve principally to alter the deflection position within the mask 20, the electromagnetic main deflector 33 and the electromagnetic sub-deflector 34. A differing deflection signal is imparted to each deflector when it is to alter the deflection position of the electron beam. When the deflection position is altered, a waiting time is required to allow settling in the new deflection position. In particular, the settling time is considerably longer with an electromagnetic deflector than with an electrostatic one. Here it is relatively short, but the greater number of changing the deflection position means that settling time is required in the same way as the electromagnetic deflector.

By adding the number of change of deflection position to the abovementioned shot density, it is possible to determine the distribution of exposure time more correctly.

There is a tendency for the settling time to increase in proportion to the amount of change in the deflection position. Consequently, the settling time can be calculated with a greater degree of accuracy if the secondary data includes the number distribution of the amount of change in the deflection position, which is to say the number of change (jump number) per amount of change (jump distance).

Figures 10, 11:
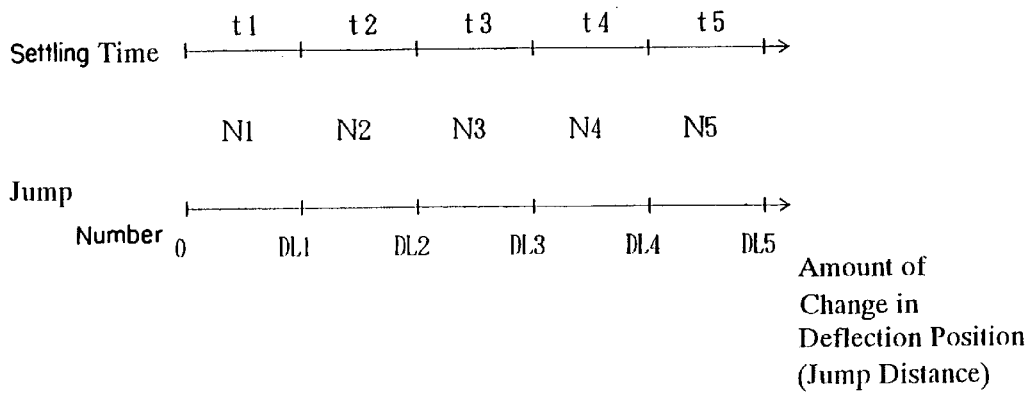
FIG. 10 shows an example of the frequency distribution of the amount of change in the deflection position.
FIG. 11 shows another example of the frequency distribution of the amount of change in the deflection position.

FIG. 10 shows an example of the number distribution of the amount of change in the deflection position. In this example, the number of change in deflection position (jump frequency) in ranges where the amount of change in the deflection position is 0–DL1, DL1–DL2 . . . DL4–DL5 is N1, N2 ... N5 respectively. This is the number distribution. Thus, by acquiring the respective settling times t1, t2 ... t5 shown above them from the apparatus file data, it is possible to determine the total settling time Ts with the aid of the following formula.

$$Ts = N1 \times t1 + \ldots + N5 \times t5$$

Thus, having this number distribution as part of the secondary data either by sub-field, band, small block area 41 or main frame allows the time required for exposure to be determined with greater accuracy. This number distribution is imparted, for instance, to the electromagnetic deflector 33 and to the electrostatic deflectors 21–24 and 34 respectively.

FIG. 11 shows another example of the number distribution of the amount of change in the deflection position. The example illustrated in FIG. 10 is a one-dimensional number distribution, while the one shown in FIG. 11 is two-dimensional. As was explained in relation to FIG. 1, the principal electrostatic deflectors are the deflectors 21–24 which deflect the electron beam within the mask 20, and the sub-deflector 34 which deflects it within the wafer 36. The electromagnetic deflector 33 has a very long settling time, with the result that even if changes in deflection position triggered by the electrostatic deflectors occur at the same time as those triggered by the electromagnetic deflector, the settling time is constrained by the latter. However, when changes in the deflection position within the main field triggered by the mask deflectors 21–24 and sub-deflector 34 occur at the same time, the settling times are similar, so that counting them both will produce a settling time which is longer than the actual one. In this case it is desirable to count whichever of the two is the longer. Usually, the longer the amount of deflection is, the longer the setting time is.

Thus, the example illustrated in FIG. 11 adopts a two-dimensional number distribution which comprises a horizontal axis representing the amount of change in the deflection position triggered by the sub-deflector 34 and a vertical axis representing the amount of change triggered by the mask deflectors 21–24. Consequently, number distribution comprises the respective numbers N11–N51 within a two-dimensional matrix. In this example, N15 for instance represents chiefly a calculation of the total settling time in accordance with the settling time for the sub-deflector 34. Meanwhile, N51 represents chiefly a calculation of the total settling time in accordance with the settling time for the mask deflectors 21–24. As has already been explained, these settling times are stored within the apparatus data file 55.

If this idea is expanded to take into consideration also settling times for the electromagnetic coils of the astigmatism corrector 11 and image surface curvature corrector 12 shown in FIG. 1, it is possible to determine the total settling time more accurately by adding the distribution of change in the drive current of these electromagnetic coils and determining the N-dimensional number distribution.

Therefore, an example of the most detailed secondary data comprises shot number, number distribution of the electromagnetic deflector as shown in FIG. 10, and two-dimensional number distribution of the electrostatic deflectors as shown in FIG. 11. Where the processing capability of the computer is sufficient, it may also utilise N-dimensional number distribution.

Figure 12:
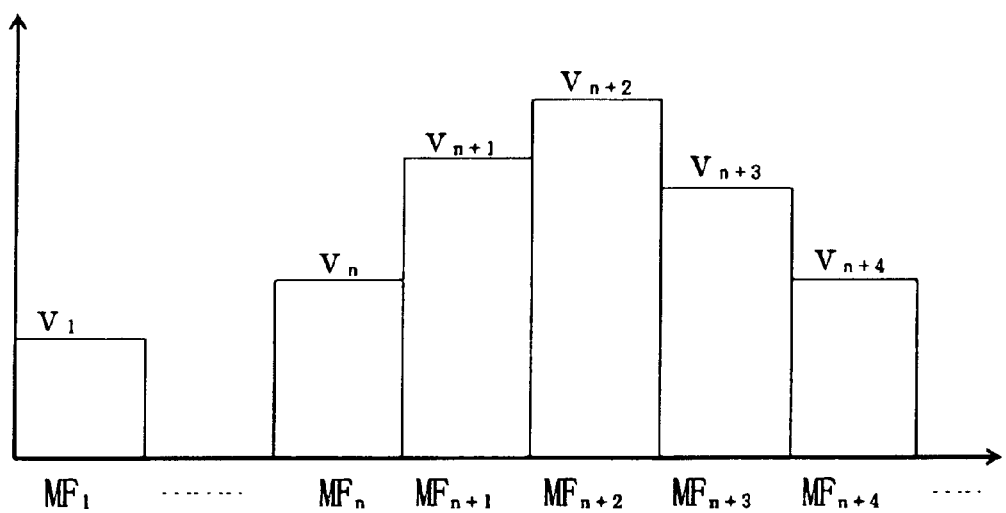
FIG. 12 shows an example of speed distribution for each of the small block 41.

FIG. 12 shows an example of speed distribution for each of the small blocks 41. The horizontal axis represents the small blocks 41 arrayed in the direction of scanning of the frame 39, while the vertical axis represents their respective speeds. In this example, the small blocks 41 are the same as the main field. Once the speeds ($v_1 \ldots v_{n+4}$) of the small blocks ($MF_1 \ldots MF_{n+4}$) consisting of a plurality of bands have been determined, the speed data is stored in the speed data file 56 as shown in FIG. 2. The calculation of this speed data is performed by the CPU 51 on the basis of data within the positional data file 52 and secondary data file 54. That is to say, the time required for exposure of each small block MF is determined from both sets of data, and the stage speed for the small blocks MF determined from the relationship with the deflection area 40.

The speed data shown here for each small block MF means the maximum speed there. This means that moving the stage at speeds in excess of this runs the risk of incomplete exposure. The stage control unit 60, therefore, controls the movement of the stage in such a way that its speed falls within the range of this speed data.

This movement control is implemented by means of a sort of servo control. As is shown in FIG. 2, the stage control unit 60 imparts a drive signal to the stage driving means 68, and at the same time monitors the speed of the stage through the stage position detecting means 69. Thus, it is possible to monitor the stage speed with the aid of the stage control unit 60 and to control it in such a way that it corresponds as closely as possible to the velocity distribution shown in FIG. 12. The servo control accompanying this feedback control is implemented through servo control means which will be self-evident to an ordinary skilled person in the filed of servo control.

Since the abovementioned secondary data is, for instance, the shot density for each sub-field, the amount of data is very small in comparison with pattern data. It may be decreased even further by setting up secondary data for each band or small block.

It is desirable that the process of determining the speed data by calculation from the secondary data and positional data be completed and the speed data stored in the file 56 before the process of exposure begins. However, the processing itself is not particularly complicated, and there is no reason why the speed data should not be generated at the same time as the pattern data generating means 58 is generating drive data from the pattern data.

Since the secondary data depends only on the pattern data, it can also be used on different exposure apparatus and under different conditions of exposure.

[Speed Control]

In an electron beam exposure apparatus, it should be renumbered in relation to the abovementioned control of stage movement that speed control must be implemented within a range where the rate of movement of the stage does not exceed the speed v shown in FIG. 12, and that it be as close as possible to the distribution shown there. This is because if circumstances occur where the stage speed exceeds the speed v, the exposure area leaves the deflection area 40, resulting in incomplete exposure. Herein lies the difference from a normal servo control.

Figure 13:
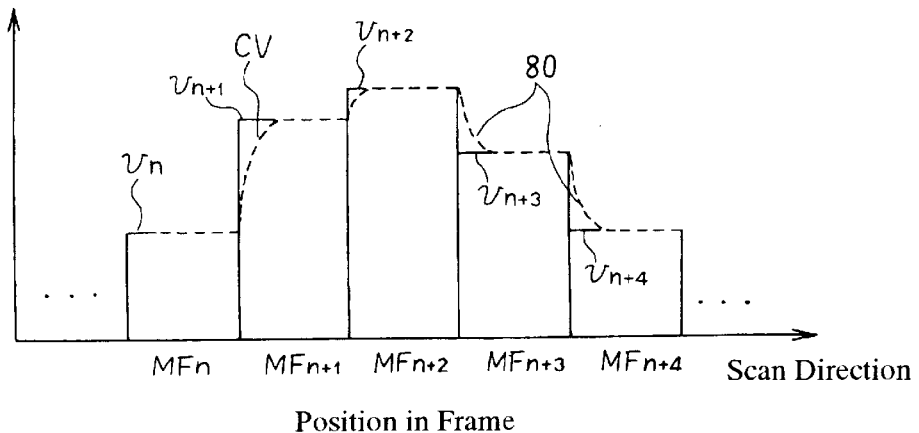
FIG. 13 shows an example of speed control where there is a risk of incomplete exposure.

FIG. 13 shows an example of speed control where there is a risk of incomplete exposure. In this example, the speed data $v_1, v_2 \ldots$ as determined for each small block area $MF_n$, $MF_{n+1} \ldots$ represents the actual speed V when the stage speed is controlled by the stage control unit 60 in accordance with $v_1, v_2 \ldots$ In this example, the stage control unit 60 has implemented acceleration and deceleration simply in accordance with speed data in the direction of scanning of the frame. As has already been stated, the rate of movement of the stage needs to be slower than the speed data v, and for this reason acceleration and deceleration are implemented at the boundaries of the small block areas, which are the points of speed change. This speed change requires a certain time because of the inertia resulting from the movement of the stage. Consequently, the actual stage speed V changes in accordance with its acceleration or deceleration (negative acceleration) from the boundary towards the target speed.

In the example shown in FIG. 13, a situation arises during movement from area $MF_n$ to area $MF_{n+1}$ where as a result of a limit in acceleration the actual speed CV is temporarily lower than the target maximum speed $v_{n+1}$. Theoretically it is better for this situation not to arise, but at least it does not lead to incomplete exposure. However, in the example shown in FIG. 13 it means that the movement from area $MF_{n+2}$ to area $MF_{n+3}$ is one from a low pattern density area to a higher one. In this case, since there is a limit to deceleration, the actual speed CV will exceed the target maximum speed $v_{n+3}$ if deceleration commences at the boundary between the two areas, as may be seen from 80. The same phenomenon occurs during movement from area $MF_{n+3}$ to area $MF_{n+4}$. If the phenomenon 80 occurs, the exposure area leaves the deflection area 40, with resulting incomplete exposure.

Consequently, it is vital to ensure through speed control that the actual stage speed does not exceed the target maximum speed of the speed data, especially during deceleration as explained above.

Figure 14:
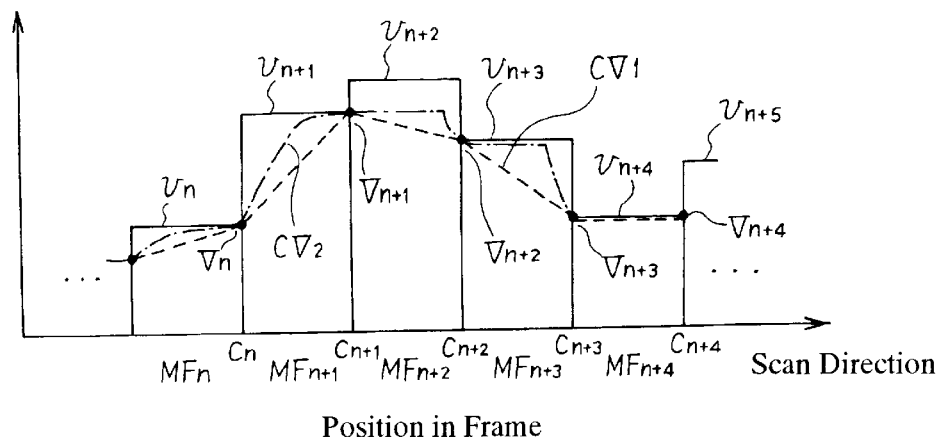
FIG. 14 shows an example of speed control which makes it possible to prevent the phenomenon 80.

FIG. 14 shows an example of speed control which makes it possible to prevent the phenomenon 80 in FIG. 13. As with FIG. 13, the horizontal axis represents the position within the frame in the direction of scanning, while the vertical axis represents the maximum speed v in each of the small blocks MF. The broken line Cv1 is an example of improved speed control. In this example, the point of speed change at the boundary of the small blocks MF is defined as the speed setting point. At this speed setting point, the slower of the speed data for the small blocks MF on both sides of the point is imparted as the set speed at that speed setting point. In the drawing, the slower ($v_n$) of the target speeds $v_n$ and $v_{n+1}$ of the small blocks $MF_n$ and $MF_{n+1}$ is imparted as the set speed $V_n$ at the speed setting point $C_n$. Similarly, the set speeds $V_{n+1}(=vn+1)$, $V_{n+2}$, $(=vn+3)$, $V_{n+3}(=vn+4)$ and $V_{n+4}$ $(=vn+4)$ are imparted at the speed setting points $C_{n+1}$, $C_{n+2}$, $C_{n+3}$ and $C_{n+4}$.

As the broken line CV1 in the drawing shows, speed control is implemented so as to follow the speeds V of the speed setting points C. Thus, in moving from area $MF_{n+2}$ to area $MF_{n+3}$, deceleration commences from the speed $V_{n+1}$ of the speed setting point $C_{n+1}$ at the left edge of the area $MF_{n+2}$ towards the speed $V_{n+2}$ of the next speed setting point $C_{n+2}$ which is at the right edge. This means that the phenomenon of the speed CV1 exceeding the maximum speed $V_{n+3}$ as in FIG. 13 does not occur. The same is true when moving from area $MF_{n+3}$ to area $MF_{n+4}$.

The speed control curve represented in the drawing by an alternating dashed and dotted line CV2 provides an example of a further improvement on the abovementioned method using speed setting points C. In this example, speed control is implemented so as to follow the speeds V of the speed setting points C as above, but acceleration commences as soon as possible after passing a speed setting point C while deceleration commences as late as possible before the speed setting point C. In this way it is possible to ensure that the speed control curve CV2 is as close as possible to the line of the maximum speed v (solid In this improved example the important thing is firstly that it should be avoided that during acceleration the actual stage speed CV2 exceed the maximum speed $v_n$ or $v_{n+1}$ by the inertia momentum of acceleration. This means, for instance, that when accelerating from the speed $V_n$ after passing the speed setting point $C_n$ in moving from the area $MF_n$ to the area $MF_{n+1}$, this acceleration should be stopped at a position before the next speed setting point $C_{n+1}$, so that there is no oscillation centring on the maximum speed $v_{n+1}$. Oscillation of this sort occurs in a simple feedback, but can be avoided by a suitable well-known feed-forward control.

Figure 15:
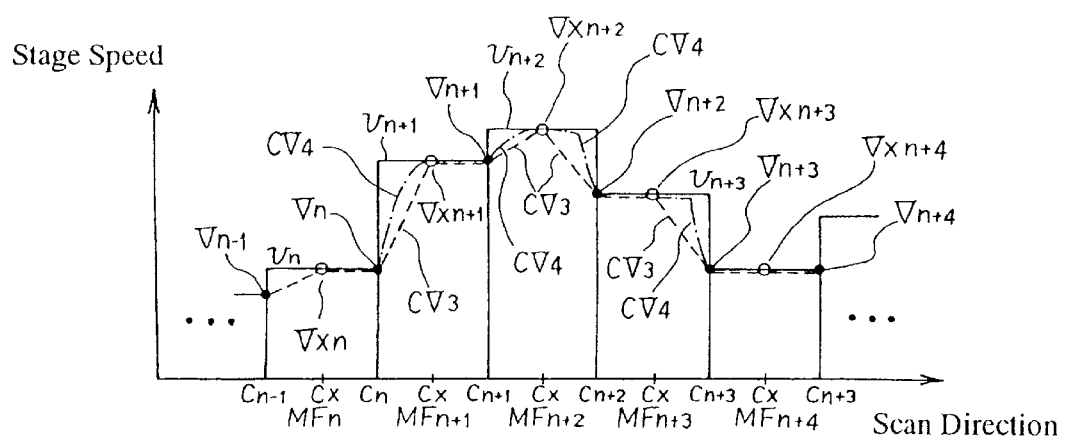
FIG. 15 shows an improved example of the speed control of FIG. 14.

FIG. 15 shows an improved example of the speed control of FIG. 14. This example is the same as the one illustrated in FIG. 14 in that the slower of the maximum speeds v of the areas MF on either side is imparted to the speed setting point C at the boundary between them. The example of FIG. 15 has the further addition of the speeds Vx with the central point of the areas as the speed setting point Cx. A speed curve Cv3 is generated along the speeds V and Vx of the speed setting points C and Cx. In other words, the broken line CV3 connecting the setting point speed V and Vx in FIG. 15 becomes the speed control curve. In this example, where for instance as in the area $MF_{n+2}$ the exposure density is lower than in either of the adjoining areas $MF_{n+1}$ or $MF_{n+3}$, it is possible to move the stage at a sufficiently high speed to further improve the exposure throughput.

With the speed control curve CV4, which is represented by an alternating dashed and dotted line, acceleration commences as early as possible and deceleration as late as possible in relation to the speed control curve CV3 represented by the broken line. This additional improvement allows the exposure time to be further shortened and the exposure throughput improved.

The generation of the abovementioned speed control curves is implemented in the stage control unit 60 in the configuration of the control unit shown in FIG. 2. The speed control curves are generated while reading speed data for each of the small block areas MF which is stored in the speed data file 56. Alternatively, the speed control curves can be generated at the same time as the speed data if the speed data is calculated from the secondary data while the stage is moving. In either case the calculation may be performed either in the CPU 51 or, if it has a high processing capability, in the stage control unit 60.

In the method illustrated in FIGS. 14 and 15 it is conceivable that deceleration may not be quick enough where a small block area MF with a high exposure density is suddenly scanned in conditions where the actual speed has increased appreciably, being controlled by a succession of small block areas MF with very low exposure densities: that is to say, even if deceleration is executed from the speed V at the beginning point of an area MF towards the speed V at the beginning point of the next area MF. As a solution, there is a method whereby the speed V of one speed setting point is re-set lower in accordance with the speed V of the next speed setting point. In other words, returning in the opposite direction to the direction of scanning, the speed V of the one speed setting point is re-set at a speed Vz which permits deceleration to the speed V of the next speed setting point. If this method it adopted, it is sometimes necessary to re-set the speed V of the previous speed setting point. This can be achieved by building recurrence into the software program which determines the speeds of the speed setting points.

Figure 16:
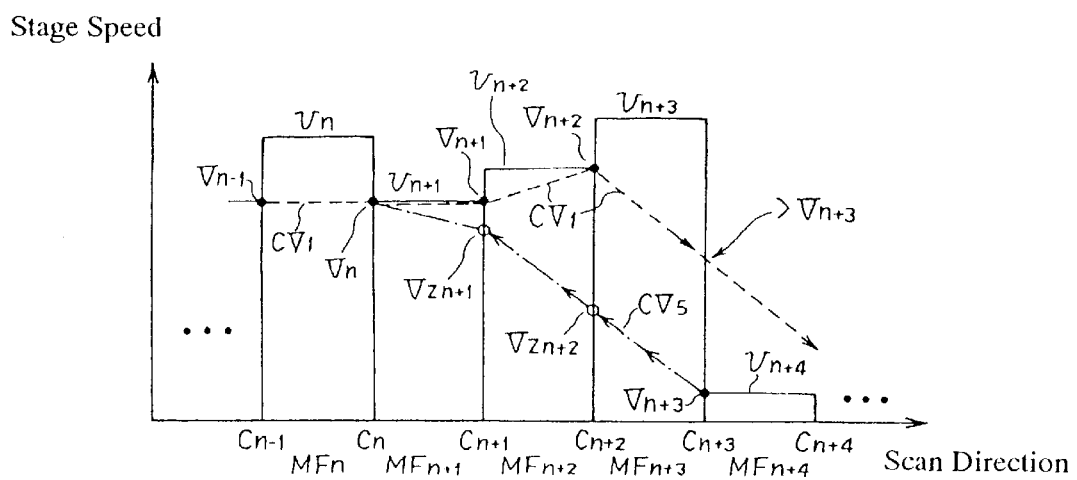
FIG. 16 shows an example where it is necessary to re-set the speed.

FIG. 16 shows an example where it is necessary to re-set the speed. In this example, speed setting points C are provided at the boundaries of the small blocks MF, and the speeds V of the speed setting points C are set as the slower of the speeds v on either side in the same way as in FIG. 14. Thus the speed control curve CV1, represented in the drawing by a broken line, is generated by the stage control unit 60.

In this example, the exposure density is relatively low in areas $MF_n$–$MF_{n+1}$, while it suddenly increases in the area $MF_{n+4}$. In such a case, the rate of movement of the stage is controlled so as to be rapid in areas $MF_n$–$MF_{n+1}$. However, during deceleration from the speed $V_{n+2}$ of the speed setting point $C_{n+2}$ towards the speed $V_{n+3}$ of the speed setting point $C_{n+3}$, the difference between the two is in excess of the deceleration capacity (below the lower limit of negative acceleration). As a result, the speed control curve CV1 is such that the speed at the boundary between the area $MF_{n+3}$ and the area $MF_{n+4}$ is considerably in excess of the speed $V_{n+3}$ of the speed setting point $C_{n+3}$. Consequently, the the speed $V_{n+3}$ of the speed setting point $C_{n+3}$. Consequently, the speed CV1 in the area $MF_{n+4}$ exceeds the maximum speed $V_{n+4}$ in that area, and it becomes impossible to expose all the exposure pattern in the area $MF_{n+4}$. Incomplete exposure of this sort must be avoided.

Figure 17:
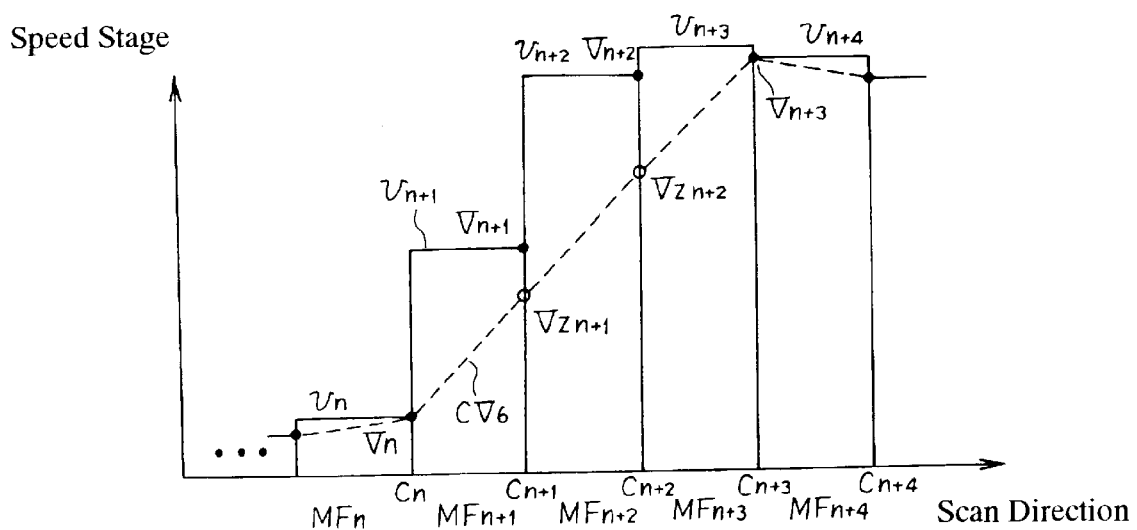
FIG. 17 shows another example where it is necessary to re-set the speed.

The speed control curve CV5, which is represented in FIG. 16 by means of an alternating dashed and dotted line, illustrates a method of solving the abovementioned problem. Suppose that even maximum deceleration from the speed $V_{n+2}$ of the speed setting point $C_{n+2}$ will not achieve the speed $V_{n+3}$ of the speed setting point $C_{n+3}$. What happens is that a fresh speed $Vz_{n+2}$, which allows the speed $V_{n+3}$ of the speed setting point $C_{n+3}$ to be achieved by maximum deceleration, is set for the speed setting point $C_{n+2}$, which is in the opposite direction from the speed setting point $C_{n+3}$ to that of scanning. The newly set speed $Vz_{n+2}$ is then assessed to determine whether or not it can be achieved as a result of maximum deceleration from the speed $V_{n+1}$ of the preceding speed setting point $C_{n+1}$. If this proves impossible, a fresh speed $Vz_{n+1}$, which allows the speed $V_{n+2}$ to be achieved by maximum deceleration, is set for the speed setting point $C_{n+1}$. The newly set speed $Vz_{n+1}$ is further assessed to determine whether or not it can be achieved as a result of maximum deceleration from the speed $V_n$ of the preceding speed setting point $C_n$. In FIG. 16, this is possible. Thus a fresh speed control curve CV5 represented by means of an alternating dashed and dotted line is generated. Methods of recurrence which are known in computer programs are valid for the purpose of scanning previously set speed FIG. 17 shows another example which illustrates re-setting the speed where it was impossible to achieve the speed V of the next speed setting point C even with maximum acceleration. In this example, scanning is implemented from the area $MF_n$ towards the areas $MF_{n+1}$, $MF_{n+2}$ and $MT_{n+3}$ with low exposure density. Maximum acceleration from the speed $V_n$ of the speed setting point $C_n$ does not allow the speed $V_{n+1}$ of the speed setting point $C_{n+1}$ at the next boundary to be achieved. In this case, a fresh speed $Vz_{n+1}$ is set as indicated by the open circle in the drawing. This speed $Vz_{n+1}$ is attainable through maximum acceleration from the speed $V_n$ of the speed setting point $C_n$. In the same way the speed of the speed setting point $C_{n+2}$ is re-set to $Cz_{n+2}$.

Figure 18:
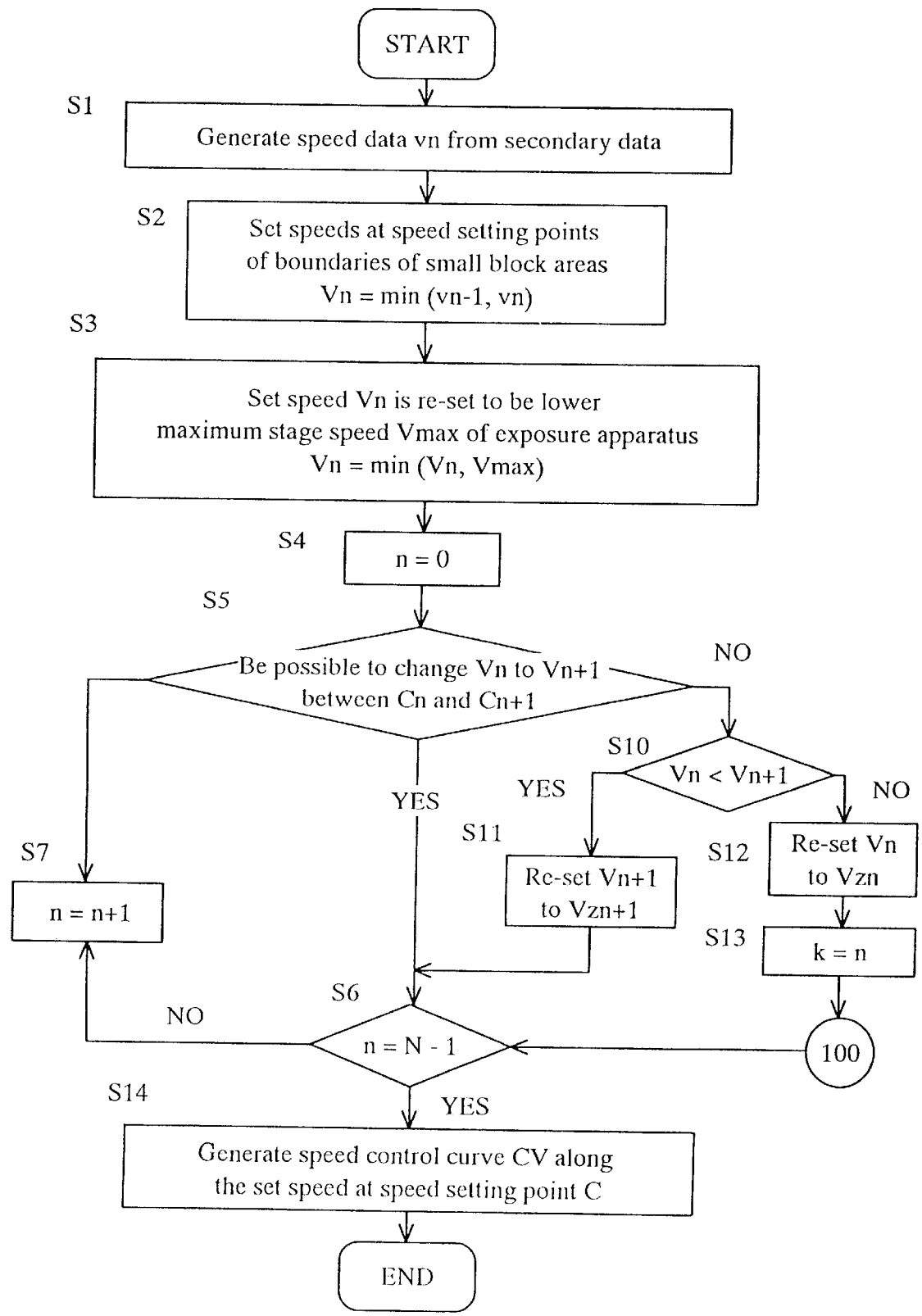
FIG. 18 is a flowchart of generating speed setting points.
Figure 19:
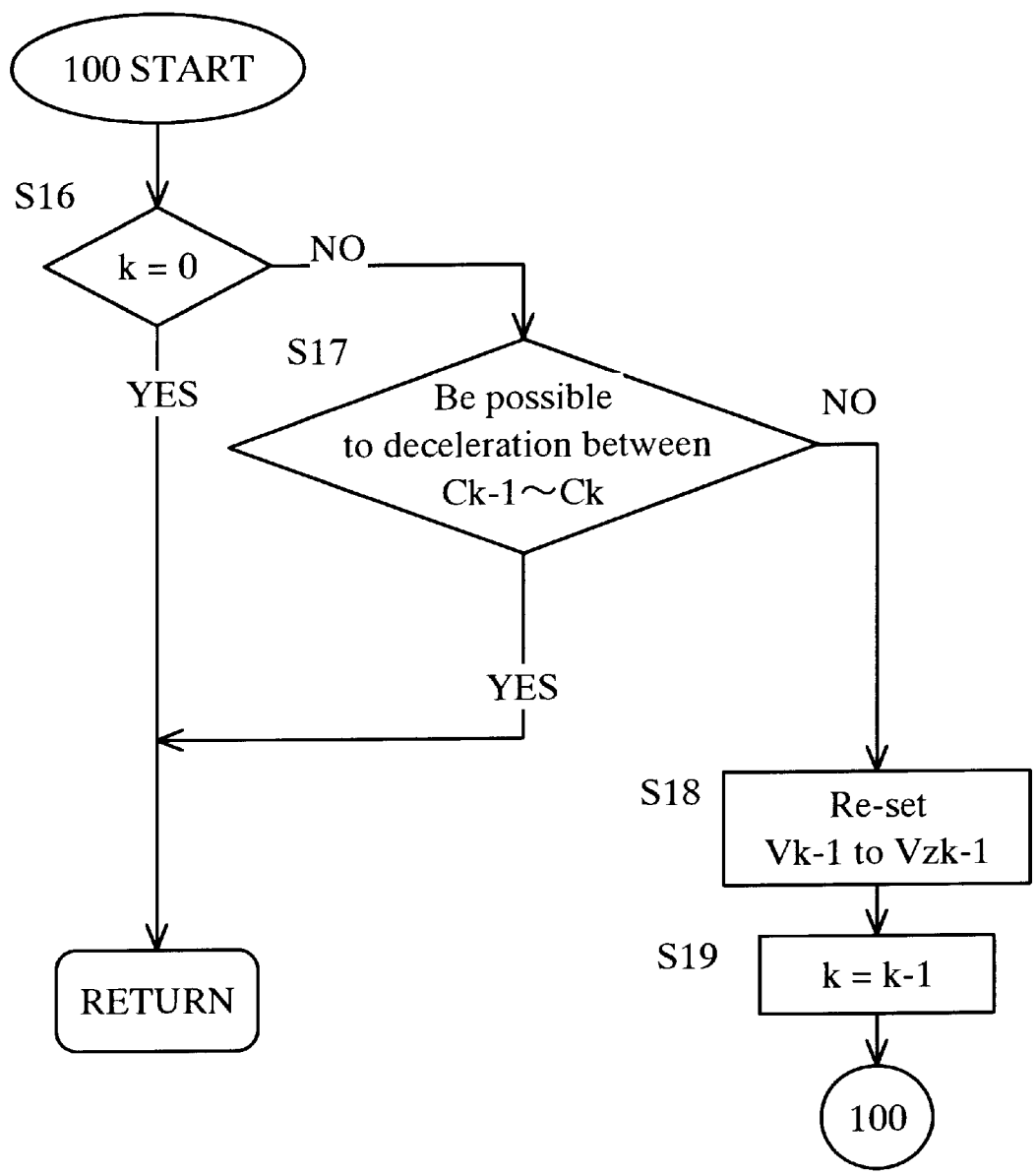
FIG. 19 is a second flowchart of generating speed setting points.

FIG. 18 is a flowchart illustrating the generation of speed setting points in accordance with the abovementioned algorithms, while FIG. 19 is a flowchart of the part with recurrence.

From a state wherein the secondary data is already stored in the secondary data file 54, the speed data $v_n$ within the small block area $MF_n$ is generated on the basis of that secondary data. The speed $v_n$ is the maximum speed at which incomplete exposure does not occur when the stage is moved at a constant rate through the small block area $MF_n$. That is to say, it is the maximum speed at which it is possible to ensure that the exposure position during exposure of the small block remains within the deflection area 40 (step S1). The speed data is stored in the speed data file 56.

Next, the boundary of the small block area is defined at the speed setting point $C_n$, and the speed is set at the slower of the maximum speeds $v_{n-1}$ and $v_n$ of the areas on either side (step S2). Speed is controlled in line with the set speed $V_n$ of the speed setting point $C_n$ so that it is possible to a considerable degree to avoid the stage speed exceeding the maximum speed within the small block area. When the central point of the small block area is also adopted as an additional speed setting point as in FIG. 15, the speed at that additional speed setting point is further set as the maximum speed in the small block area to which it belongs.

Step S3 has not been described, but is a process whereby a check is implemented in order to confirm whether or not the set speed $V_n$ is in excess of the maximum stage speed value $V_{max}$ of the exposure apparatus. If so, it is re-set to the maximum value of the device.

The speed $V_n$ is imparted to each speed setting point $C_n$ (n=0~N−1) in the direction of scanning of the frame 39, and the speed altered by the maximum acceleration or deceleration of the device as illustrated in FIGS. 16 and 17. A check is implemented in order to ascertain whether it is possible to change from the set speed $V_n$ to $V_{n+1}$ between the adjoining speed setting points $C_n$ and $C_{n+1}$. This process is conducted in steps S3 to S13, and the recurrence sub-routine of FIG. 19.

First, since in this example scanning is from the start towards the finish, the value of n is set at the initial value 0 (step S4), and a check is implemented in order to ascertain whether it is possible to change from the set speed $V_n$ to $V_{n+1}$ between the adjoining speed setting points $C_n$ and $C_{n+1}$. In this process, a calculation establishes whether or not it is possible to change from the speed $V_n$ to $V_{n+1}$ through acceleration or deceleration of the stage of the exposure apparatus. If it is possible, the value n is incremented (step S7), and this is continued until the final speed setting point $C_{N-1}$ is reached (step 6).

Suppose that at step S5 acceleration or deceleration is assessed to be impossible. If it is acceleration which is impossible ($V_n$<$V_{n+1}$), the speed $V_{n+1}$ is re-set to a new speed $Vz_{n+1}$ where acceleration is possible (step S11). This point is elucidated in FIG. 17. If deceleration is impossible ($V_n$>$V_{n+1}$), the speed $V_n$ is re-set to a new speed $Vz_n$ where deceleration is possible from the speed $V_{n+1}$ (step S12). This is shown in FIG. 16.

If the speed $V_n$ is re-set to $Vz_n$ because deceleration is assessed to be impossible, a check must be implemented in order to establish whether or not deceleration from the previous speed setting point $C_{n-1}$ is possible. In step S13, a value k is set for the current value n, and a recurrence sub-routine 100 called up. The sub-routine 100 is configured as illustrated in the flowchart which forms FIG. 19. Steps S17, S18 and S19 are repeated, and the sub-routine 100 is called up until the initial speed setting point $C_0$ is reached (step S16). Until the initial speed setting point $C_0$ is reached, a check is repeatedly performed in step S17 in order to establish whether or not acceleration or deceleration is possible between the speed $V_{k-1}$ of the previous speed setting point $C_{k-1}$ and the re-set speed $Vz_k$ of the current speed setting point $C_k$. If acceleration or deceleration is possible, the sub-routine ends and a return to the original routine is executed. If acceleration and deceleration are impossible, the speed $V_{k-1}$ is re-set again to a fresh speed $Vz_{k-1}$ which allows of acceleration or deceleration. The value k is decremented (k=k−1) (step S18), and the sub-routine 100 is called up again.

By employing the method of the abovementioned reccurence sub-routine, it is possible to re-set to speeds at which acceleration or deceleration is possible between all the speed setting points. Returning to FIG. 18, the speed control curve CV is generated in line with the most recently set speeds V, and the speed of the stage is controlled in accordance with the speed control curve Cv. In the abovementioned flowchart, if the change in the set speed of speed setting point Cn+1 from the Cn which adjoins each other in the direction of scanning from the start point (n=0) within the frame 39 requires a degree of deceleration which exceeds the value of the upper limit of deceleration (is less than the value of the lower limit of negative acceleration), the set speed of the speed setting point Cn is re-set lower. Then, going back one investigation point, a check is implemented in order to determine whether or not a change in set speed is possible between the speed setting points Cn−1 and Cn.

Similar algorithms may be employed in order to investigate whether or not it is possible to alter the set speed of the speed setting point Cn+1 from Cn which adjoins each other in the opposite direction to the direction of scanning from the finish point within the frame 39. In this case, an assessment is performed in order to determine whether the change in the set speed of the speed setting point Cn+1 from Cn requires a degree of acceleration in excess of the value of the upper limit of acceleration (positive acceleration). If it does, the set speed of the speed setting point Cn+1 is re-set lower. Then, going back one investigation point in acceleration, the speed setting points Cn+1 and Cn+2 may be re-examined. In this case, the similar recurrence subroutine program is used as well.

Once the speeds Vn have been set at each of the speed setting points Cn as illustrated in FIGS. 16–19, servo control can be implemented in line with these set speeds Vn as shown in FIGS. 14 and 15. In this case, it is desirable that acceleration be implemented immediately after a speed setting point, and deceleration well before the next one in accordance with the alternating dashed and dotted line in FIGS. 14 and 15.

Figure 20:
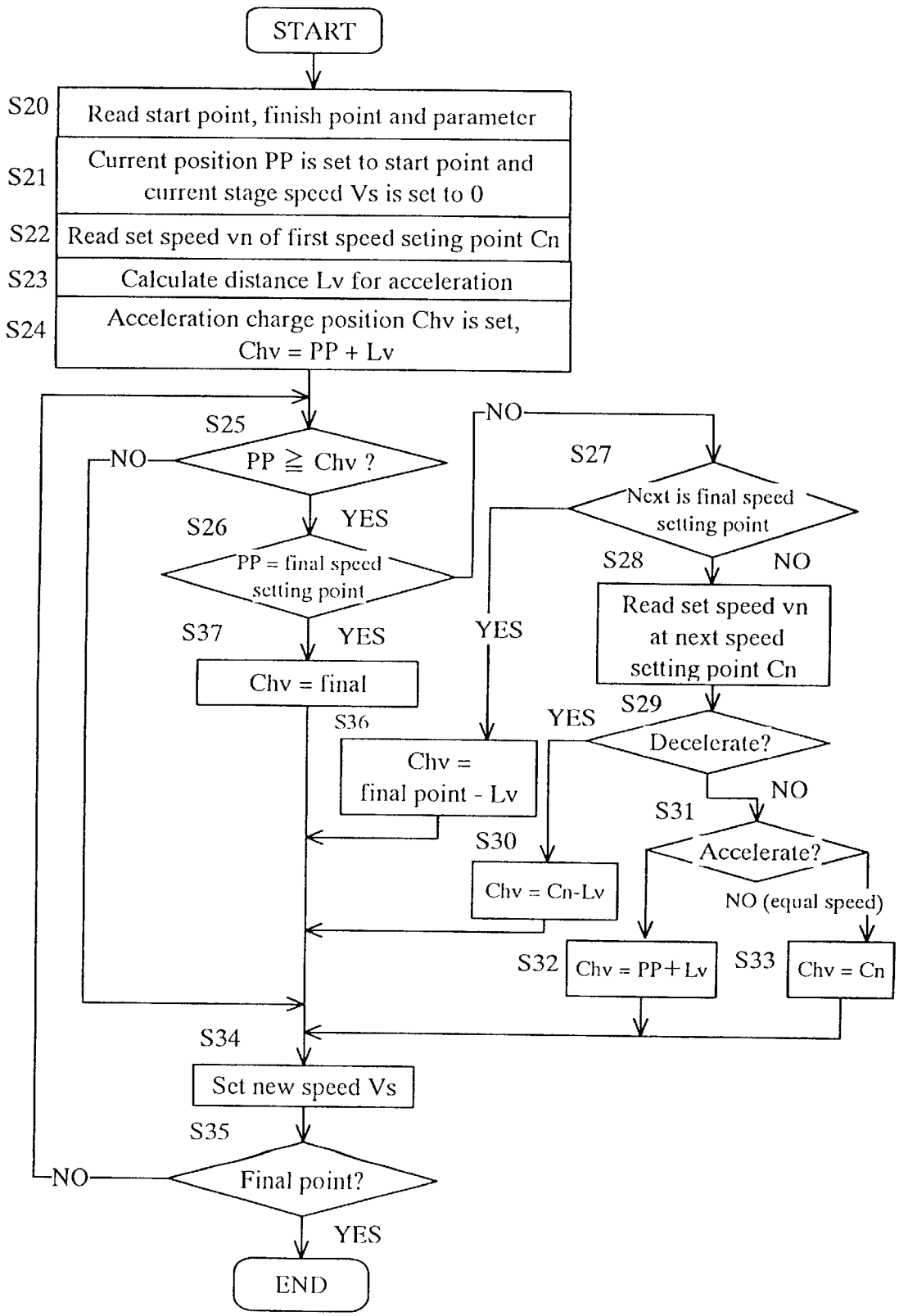
FIG. 20 is a flowchart showing servo control of speed.

FIG. 20 is a flowchart showing servo control of the speed. In the servo control illustrated in this drawing, the distance Lv required for acceleration or deceleration from the current speed to the speed of the next speed setting point is determined. In the case of acceleration, the position at which the acceleration finishes is defined as the acceleration change position Chv, while in the case of deceleration, the point at which deceleration is to commence is defined as the acceleration change position Chv. This acceleration change position Chv is the target for acceleration or deceleration. Control in this flowchart is implemented by the stage control unit 60.

First, the start point, finish point, parameters and other data are read as initial values (S20). The current position PP is set to start position, and the current stage speed Vs is set at 0 (S21). The set speed vn of the first speed setting point Cn is read (S22), and the distance (Lv) required for acceleration is computed (S23). An acceleration change position Chv is set, where acceleration is to be halted after commencing from the current position. This acceleration change position Chv is obtained by adding the acceleration distance Lv to the current position PP (S24). The stage is moved while accelerating in accordance with step S24 until in step S25 the current position PP reaches the acceleration change position Chv.

Once the current position PP reaches the acceleration change position Chv at step 25 and assuming that the next speed setting point is not the final one (S27), control is executed in the loop consisting of steps S28–35 and S25–27 so that acceleration occurs as early as possible, and deceleration as late as possible.

In step S28 the set speed vn at the next speed setting point Cn is read, and an assessment is performed on the basis of a comparison between the current speed and the set speed vn as to whether to accelerate, decelerate or maintain an equal speed (S29, 31). In the case of deceleration the required distance Lv is determined, and the next acceleration change position Chv is re-set at the next speed setting position Cn−Lv. In the case of acceleration the required distance Lv is determined, and the position where the target speed will be attained if acceleration is executed immediately after that is set as a fresh acceleration change position Chv (=PP+Lv). If an equal speed is to be maintained, the next speed setting point Cn is set as the acceleration change position Chv.

Deceleration does not commence until the next acceleration change position Chv, while acceleration commences immediately and finishes at the next acceleration change position Chv. Equal speed means that there is neither acceleration nor deceleration until the next acceleration change position. The new speed in the case of acceleration or deceleration is set in step S34.

The loop consisting of steps S25, S34 and S35 is repeated until the next acceleration change position Chv is reached.

Where the next speed setting point is the final one, a position obtained by subtracting the distance Lv required for deceleration from the finish point after the final speed setting point is taken as the acceleration change position Chv (S36). When the current position PP reaches the final speed setting point (S26), the acceleration change position Chv is re-set as the finish point, and control of the stage terminates when the finish point is reached (S35).

The abovementioned servo control allows the speed of the stage to be set without exceeding the set speeds Vn of the speed setting points Cn and at a speed as high as possible.

As has been explained above, the present invention facilitates variable-rate charged particle beam exposure at the highest speed within a range compatible with complete exposure, and makes it possible to shorten the throughput of the exposure process.

Moreover, inasmuch as secondary data is generated in relation to exposure times determined from pattern data, it also makes it possible to determine the speed distribution in the direction of scanning even with a different exposure apparatus.

Furthermore, inasmuch as speed data including the speed distribution in the direction of scanning of the sample which is to be exposed is used in order to control the rate of movement to a speed which does not exceed the maximum speed at which exposure is possible, throughput is shorter while there is no risk of incomplete exposure.

What is claimed is:

1. A method of charged particle beam exposure wherein an area of an exposure pattern is exposed by irradiating a sample with a charged particle beam while moving said sample wherein secondary data, including at least density information of the exposure pattern and being in common for plural exposure apparatuses, is generated in advance from a pattern data including at least data of the exposure pattern and data of an exposure position, the exposure for each exposure apparatus comprising:
storing the secondary data in the exposure apparatus;
generating speed data including a speed distribution in a direction of movement of the sample in accordance with the secondary data and a characteristic of the exposure apparatus; and
irradiating the sample with the charged particle beam in accordance with the pattern data while being moved at variable speed in accordance with the speed data.

2. A method of charged particle beam exposure according to claim 1, wherein:

the secondary data is configured to include the density information of small block areas, which the exposure pattern is divided into, by the small block areas or by divided areas of the said small block areas, and the speed data including rates of movement of the sample by the said small block areas is generated in the speed data generating step.

3. A method of charged particle beam exposure according to claim 1, wherein:

the sample is irradiated a plurality of times with a charged particle beam having a specified shape in the step of irradiation with the charged particle beam; and the secondary data includes at least the number of the irradiation.

4. A method of charged particle beam exposure according to claim 3, wherein:

in the step of generating the speed data, the speed data is generated on the basis of exposure time distribution in accordance with a product of the number of irradiation in the secondary data and the respective irradiation times.

5. A method of charged particle beam exposure according to claim 1, wherein:

the sample is irradiated with a charged particle beam having a specified shape and being deflected on to a predetermined position on the sample in the step of irradiation with the charged particle beam; and the secondary data includes at least the number of change in the deflection position.

6. A method of charged particle beam exposure according to claim 5, wherein:

in the step of generating the speed data, the speed data is generated on the basis of an exposure time distribution in accordance with a product of the number of change in the deflection position in the secondary data and a deflection time required to change the deflection position of deflectors in an exposure apparatus.

7. A method of charged particle beam exposure according to claim 5, wherein:

the secondary data includes at least number distribution comprising the number of change in the deflection position against an amount of change in the deflection position.

8. A method of charged particle beam exposure according to claim 7, wherein:

in the process of generating the speed data, the speed data is generated on the basis of an exposure time distribution in accordance with a cumulative product of the number of change in the deflection position against the amount of change in the deflection position which is included in the number distribution of the secondary data, and the time required to change the deflection position according to each amount of change in the deflection position.

9. A method of charged particle beam exposure according to claim 1, wherein:

in the step of irradiation with the charged particle beam, the charged particle beam is deflected on to a specified position on a mask and formed into a desired shape, and the sample is irradiated with the charged particle beam having the desired shape and being deflected on to a specified position on the sample; and the secondary data includes at least a number of change in the deflection position on the said mask and the number of change in the deflection position on the sample.

10. A method of charged particle beam exposure according to claim 9, wherein:

the secondary data includes at least two-dimensional number distribution comprising the amount of change in the deflection position on the mask and the amount of change in the deflection position on the sample.

11. A method of charged particle beam exposure according to claim 9, wherein:

in the step of generating the speed data, the speed data is generated in accordance with the cumulative product of the number of change in the deflection position of the secondary data or the number of change in the two-dimensional number distribution, and the time required to change the respective deflection position.

12. A charged particle beam exposure apparatus wherein a sample is exposed to an exposure pattern by being irradiated with a charged particle beam, comprising:

a pattern data file storing pattern data including at least an irradiation pattern and an irradiation position of the exposure pattern;

a secondary data file storing secondary data which is generated in advance from the pattern data, includes at least density information of the exposure patterns for a plurality of areas, and is in common for exposure apparatuses;

an exposure unit exposing the sample into the exposure pattern by deflecting and irradiating the said charged particle beam on to a specified position on the sample; and a sample movement control unit for moving the sample continuously at a variable rate in accordance with the secondary data and a characteristic of the exposure apparatus.

13. A charged particle beam exposure apparatus according to claim 12, wherein:

the secondary data comprises at least the number of irradiation of the charged particle beam.

14. A charged particle beam exposure apparatus according to claim 12, wherein:

the secondary data comprises at least the number of change in the deflection position of the charged particle beam.

15. A method of charged particle beam exposure wherein an area of an exposure pattern on a sample is exposed by deflecting and irradiating a charged particle beam while moving the sample, comprising:

determining a rate of movement corresponding to each small block area in accordance with the density of the exposure pattern within the small block area, each of the small block areas being within a frame area which has a width within a range wherein the deflection is attainable, and extends in the direction of the sample scanning as a result of the movement, the frame area being divided into the small block areas in the direction of the sample scanning;

defining the boundaries of the small block areas as speed setting points, and setting the slower of the rates of movement of the small block areas on either side of the speed setting point as a speed of the speed setting point;

sampling groups of two adjoining speed setting points in turn in the direction of scanning from the can beginning point in the frame, and decreasing the set speed of the speed setting point n if the change in the set speed between one speed setting point n and the next speed setting point n+1 requires a degree of acceleration which is less than a lower limit of a negative acceleration of the exposure apparatus, and sampling the previous speed setting point so as to assess whether or not the change in set speed between the speed setting point n−1 and the speed setting point n is within the range of an upper and lower limit of the acceleration; and deflecting and irradiating the charged particle beam to the sample while the sample is moved at a variable rate of movement corresponding to the speed of the speed setting points and not exceeding the rate of movement at each of the small block areas.

16. A method of charged particle beam exposure according to claim 15, further comprising:

a step of defining a specified position within the small block area as an additional speed setting point, and setting the maximum rate of movement of the small block area as the speed of the additional speed setting point, wherein the sample is moved during the beam irradiation step at the variable rate of movement along with the set speed of the speed setting points and the additional speed setting points.

17. A method of charged particle beam exposure according to claim 15, wherein:

the rate of movement of each of the small block areas is the maximum rate of movement at which it is possible to expose the small block area while moving the sample at a constant speed.

18. A method of charged particle beam exposure wherein an area of an exposure pattern on a sample is exposed by deflecting and irradiating a charged particle beam while moving the sample, comprising steps of:

determining a rate of movement corresponding to each small block area in accordance with the density of the exposure pattern within the small block area, each of the small block areas being within a frame area which has a width within a range wherein the deflection is attainable, and extends in the direction of the sample scanning as a result of the movement, the frame area being divided into the small block areas in the direction of the sample scanning;

defining the boundaries of the small block areas as speed setting points, and setting the slower of the rates of movement of the small block areas on either side of the speed setting point as a speed of the speed setting point;

sampling groups of two adjoining speed setting points in turn in the reverse direction of scanning from the scan ending point in the frame, and decreasing the set speed of the speed setting point n+1 if the change in the set speed between one speed setting point n and the next speed setting point n+1 requires a degree of acceleration which is less than a upper limit of a positive acceleration of the exposure apparatus, and sampling the previous speed setting point so as to assess whether or not the change in set speed between the speed setting point n+1 and the speed setting point n+2 is within the range of an upper and lower limit of the acceleration; and deflecting and irradiating the charged particle beam to the sample while the sample is moved at a variable rate of movement corresponding to the speed of the speed setting points and not exceeding the rate of movement at each of the small block areas.

19. A method of charged particle beam exposure according to claim 18, wherein:

the rate of movement of each of the small block areas is the maximum rate of movement at which it is possible to expose the small block area while moving the sample at a constant speed.

20. A method of charged particle beam exposure according to claim 18, further comprising:

a step of defining a specified position within the small block area as an additional speed setting point, and setting the maximum rate of movement of the small block area as the speed of the additional speed setting point, wherein the sample is moved during the beam irradiation step at the variable rate of movement along with the set speed of the speed setting points and the additional speed setting points.

21. A charged particle beam exposure apparatus wherein a sample is exposed to an exposure pattern by being irradiated with a charged particle beam, comprising:

a pattern data file storing pattern data including at least an irradiation pattern and an irradiation position of the exposure pattern;

a secondary data file storing secondary data which is generated in advance from the pattern data, includes at least density information of the exposure patterns for a plurality of areas, and is in common for exposure apparatuses;

exposure unit for exposing the sample into the exposure pattern by deflecting and irradiation the charged particle beam on to a specified position on the sample; and sample movement control unit for moving the sample wherein the rate of movement corresponding to each small block area is determined in accordance with the density of the secondary data within the small block area and a characteristic of the exposure apparatus, each of the said small block areas being within a frame area which has a width within a range wherein the deflection is attainable and extends in the direction of the sample scanning as a result of the movement, the frame area being divided into the small block areas in the direction of the sample scanning.

* * * * *

UNITED STATES PATENT AND TRADEMARK OFFICE
CERTIFICATE OF CORRECTION

PATENT NO.   : 6,015,975

DATED        : January 18, 2000

INVENTOR(S) : Kawakami et al.

It is certified that error appears in the above-identified patent and that said Letters Patent is hereby corrected as shown below:

On The Title page, item [73] Assignee should read --
        Fujitsu Limited, Kawasaki, Japan;
        Advantest Corporation, Asahi, Japan --.

Signed and Sealed this

Sixteenth Day of May, 2000

*Attest:*

Q. TODD DICKINSON

*Attesting Officer*        *Director of Patents and Trademarks*

UNITED STATES PATENT AND TRADEMARK OFFICE
CERTIFICATE OF CORRECTION

PATENT NO.: 6,015,975
DATED : January 18, 2000
INVENTOR(S): Kawakami et al.

It is certified that errors appears in the above-identified patent and that said Letters Patent is hereby corrected as shown below:

On the Title page, item [73] Assignee should read
--Fujitsu Limited, Kawasaki, Japan;
  Advantest Corporation, Tokyo, Japan--.

This certificate supersedes Certificate of Correction issued May 16, 2000.

Signed and Sealed this

Twelfth Day of September, 2000

Attest:

Attesting Officer

Q. TODD DICKINSON

Director of Patents and Trademarks